United States Patent
Shim et al.

(10) Patent No.: US 9,246,119 B2
(45) Date of Patent: Jan. 26, 2016

(54) ORGANIC ELECTROLUMINESCENT DEVICE AND MANUFACTURING METHOD THEREOF

(71) Applicant: SAMSUNG DISPLAY CO., LTD., Yongin, Gyeonggi-Do (KR)

(72) Inventors: Jihye Shim, Yongin-si (KR); Jihwan Yoon, Yongin-si (KR); Chang-ho Lee, Suwon-si (KR); Jinyoung Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 323 days.

(21) Appl. No.: 13/923,265

(22) Filed: Jun. 20, 2013

(65) Prior Publication Data

US 2014/0209870 A1 Jul. 31, 2014

(30) Foreign Application Priority Data

Jan. 25, 2013 (KR) .................. 10-2013-0008678

(51) Int. Cl.
  *H01L 51/56* (2006.01)
  *H01L 51/50* (2006.01)
  *H01L 51/52* (2006.01)
  *H01L 27/32* (2006.01)

(52) U.S. Cl.
  CPC ........ *H01L 51/5036* (2013.01); *H01L 51/5265* (2013.01); *H01L 27/3211* (2013.01)

(58) Field of Classification Search
  CPC ............ H01L 51/5036; H01L 51/5265; H01L 27/3211
  USPC .......................................... 313/511, 503–504
  See application file for complete search history.

(56) References Cited

U.S. PATENT DOCUMENTS

| | | | |
|---|---|---|---|
| 2008/0164809 A1 | 7/2008 | Matsunami et al. | |
| 2012/0243219 A1* | 9/2012 | Ohsawa | H01L 51/5265 362/230 |
| 2012/0286305 A1* | 11/2012 | Sasaki | H01L 27/3206 257/89 |

FOREIGN PATENT DOCUMENTS

KR  10-2007-0081965 A  8/2007

* cited by examiner

*Primary Examiner* — Tracie Y Green
(74) *Attorney, Agent, or Firm* — Christie, Parker & Hale, LLP (57) ABSTRACT

An organic electroluminescent device includes a plurality of main pixels. Each of the main pixels includes red, green, and blue sub-pixels. Each of the sub-pixels includes a first electrode, a second electrode opposite to the first electrode, and an organic light emitting layer between the first and second electrode. The organic light emitting layer of each of the sub-pixels includes a blue light emitting layer and a green light emitting layer. Optical microresonator distances of the red, green, and blue sub-pixels are different from each other.

10 Claims, 8 Drawing Sheets

ORGANIC ELECTROLUMINESCENT DEVICE AND MANUFACTURING METHOD THEREOF

CROSS-REFERENCE TO RELATED APPLICATION

This application claims priority to and the benefit of Korean Patent Application No. 10-2013-0008678, filed on Jan. 25, 2013, the entirety of which is incorporated by reference herein.

BACKGROUND

Embodiments of the present invention relate to an organic electroluminescent device with a main pixel including a red sub-pixel, a green sub-pixel, and a blue sub-pixel, and a method of manufacturing the same.

SUMMARY

Embodiments of the present invention provide an organic electroluminescent device capable of reducing the number of depositing processes using a fine metal mask and a method of manufacturing the same.

In one embodiment, an organic electroluminescent device includes an organic electroluminescent device including: a plurality of main pixels, each of the main pixels including a red sub-pixel, a green sub-pixel, and a blue sub-pixel. Here, each of the red sub-pixel, the green sub-pixel, and the blue sub-pixel includes: a first electrode; a second electrode opposite to the first electrode; and an organic light emitting layer between the first electrode and the second electrode, the organic light emitting layer including a blue light emitting layer and a green light emitting layer, one of the first electrode or the second electrode includes a semitransparent material and an other one of the first electrode or the second electrode includes a light reflection material, an optical microresonator distance is defined between the first electrode and the second electrode, and the optical microresonator distance of one of the red sub-pixel, the green sub-pixel, or the blue sub-pixel is different from the optical microresonator distance of other ones of the red sub-pixel, the green sub-pixel, or the blue sub-pixel.

In another embodiment, a method manufacturing an organic electroluminescent device includes: preparing a substrate having a red sub-pixel region, a green sub-pixel region, and a blue sub-pixel region; forming a first electrode on each of the red sub-pixel region, the green sub-pixel region, and the blue sub-pixel region; forming an organic light emitting layer including a blue light emitting layer and a green light emitting layer on the first electrode of each of the red sub-pixel region, the green sub-pixel region, and the blue sub-pixel region; and forming a second electrode on the organic light emitting layer of each of the red sub-pixel region, the green sub-pixel region, and the blue sub-pixel region. Here, one of the first electrode or the second electrodes includes a semitransparent material, and an other one of the first electrode includes a light reflection material.

BRIEF DESCRIPTION OF THE DRAWINGS

The above and other aspects of the present invention will become more apparent in view of the accompanying detailed description and drawings, in which.

DETAILED DESCRIPTION

The present invention will now be described more fully hereinafter with reference to the accompanying drawings, in which exemplary embodiments of the present invention are shown. Aspects and features of the present invention and methods of achieving them will be apparent from the following exemplary embodiments that will be described in more detail with reference to the accompanying drawings. It should be noted, however, that the present invention is not limited to the following exemplary embodiments, and may be implemented in various forms. Accordingly, the exemplary embodiments are provided only to describe the present invention and to inform those skilled in the art how to make and use the present invention. Embodiments of the present invention are not limited to the specific examples provided herein and, in the drawings, elements may be exaggerated for clarity.

Additionally, the embodiments in the detailed description may be described with sectional views as exemplary views of the present invention. Accordingly, shapes of the exemplary views may be modified according to manufacturing techniques and/or allowable errors. Therefore, the embodiments are not limited to the specific shapes illustrated in the exemplary views, but may include other shapes.

Hereinafter, a wavelength of light (e.g., a predetermined light) means a peak wavelength in a wavelength band of the light (e.g., the predetermined light). For example, wavelengths of red, green, and blue lights mean peak wavelengths in wavelength bands of the red, green, and blue lights, respectively. For example, the wavelength of the red light means the peak wavelength in the wavelength band having a range from about 570 nm to about 650 nm, the wavelength of the green light means the peak wavelength in the wavelength band having a range from about 520 nm to about 560 nm, and the wavelength of the blue light means the peak wavelength in the wavelength band having a range from about 430 nm to about 500 nm.

Hereinafter, embodiments of the present invention will be described in more detail with reference to the drawings.

Figure 1:
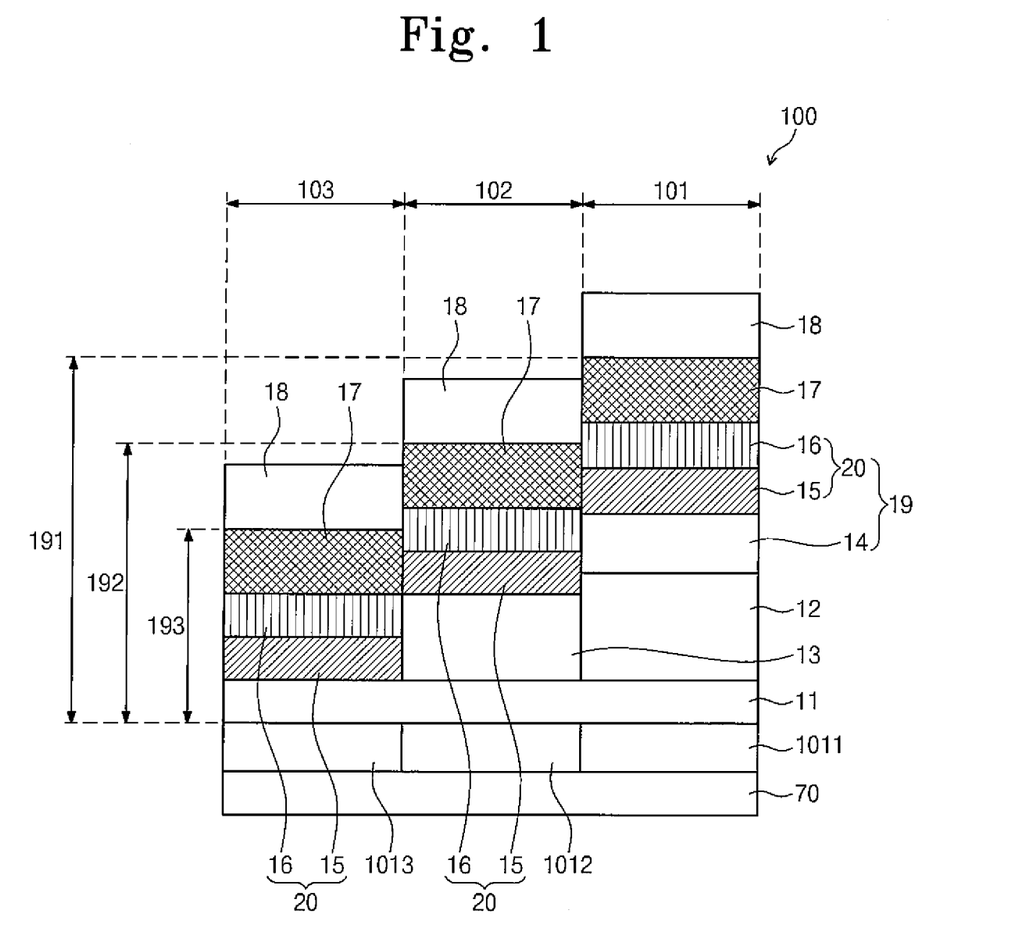
FIG. 1 is a cross-sectional view illustrating an organic electroluminescent device according to an embodiment of the present invention.

FIG. 1 is a cross-sectional view illustrating an organic electroluminescent device according to one embodiment of the present invention.

An organic electroluminescent device according to one embodiment includes a plurality of main pixels 100. The main pixels 100 may have substantially the same structure. Thus, one main pixel 100 will be described in detail hereinafter.

As illustrated in FIG. 1, the main pixel 100 includes a red sub-pixel 101, a green sub-pixel 102, and a blue sub-pixel 103. The red sub-pixel 101 includes a first electrode 1011, a second electrode 18 opposite to the first electrode 1011, and an organic light emitting layer 19 between the first electrode 1011 and the second electrode 18. The green sub-pixel 102 includes a first electrode 1012, a second electrode 18 opposite to the first electrode 1012, and an organic light emitting layer 20 between the first electrode 1012 and the second electrode 18. And, the blue sub-pixel 103 includes a first electrode 1013, a second electrode 18 opposite to the first electrode 1013, and an organic light emitting layer 20 between the first electrode 1013 and the second electrode 18

The organic light emitting layer 19 of the red sub-pixel 101 includes a red light emitting layer 14, a blue light emitting layer 15, and a green light emitting layer 16. The organic light emitting layer 20 of the green sub-pixel 102 includes the blue light emitting layer 15 and the green light emitting layer 16. The organic light emitting layer 20 of the blue sub-pixel 103 also includes the blue light emitting layer 15 and the green light emitting layer 16.

The red sub-pixel 101 may include a first assistant layer 12 between the first electrode 1011 and the organic light emitting layer 19. The green sub-pixel 102 may further include a second assistant layer 13 between the first electrode 1012 and the organic light emitting layer 20. In the present embodiment, the first assistant layer 12 is between the first electrode 1011 and the organic light emitting layer 19, and the second assistant layer 13 is between the first electrode 1012 and the organic light emitting layer 20. However, the present invention is not limited thereto. For example, in one embodiment, the first assistant layer 12 may be between the organic light emitting layer 19 and the second electrode 18 in the red sub-pixel 101, and the second assistant layer 13 may be between the organic light emitting layer 20 and the second electrode 18 in the green sub-pixel 102. In another embodiment, one of the first or second assistant layers 12 or 13 may be between the first electrode 1011 or 1012 and the organic light emitting layer 19 or 20, and the other may be between the organic light emitting layer 19 or 20 and the second electrode 18.

Figure 4:
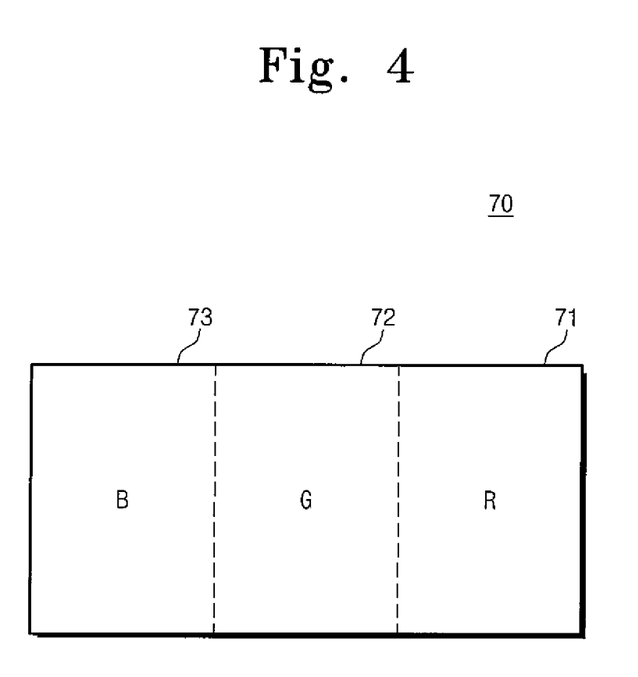
FIG. 4 is a plan view illustrating a substrate according to an embodiment of the present invention.

The sub-pixels 101, 102, and 103 may be on a substrate 70. As illustrated in FIG. 4, the substrate 70 may include sub-pixel regions 71, 72, and 73. The sub-pixels 101, 102, and 103 may be on the sub-pixel regions 71, 72, and 73 of the substrate 70, respectively. The substrate 70 may include transistors (not shown).

One of the first electrodes 1011, 1012, or 1013 or the second electrode 18 may be an anode, and the other may be a cathode. In the organic electroluminescent device, a direction from the first electrode to the second electrode may be defined as a front side direction, and a direction from the second electrode to the first electrode may be defined as a back side direction. The organic electroluminescent device may emit light in the front side direction or in the back side direction. If the organic electroluminescent device emits the light in the front side direction, each of the first electrodes 1011, 1012, and 1013 may include a thin metal having a light reflection property and a transparent conductive metal oxide on the thin metal, and the second electrode 18 may be formed of a semi-transparent thin metal. Alternatively, if the organic electroluminescent device emits the light in the back side direction, each of the first electrodes 1011, 1012, 1013 may include a semitransparent thin metal and a transparent conductive metal oxide on the semitransparent thin metal, and the second electrode 18 may be formed of a thick metal having a total reflection property.

When a voltage is applied between the first electrode 1011, 1012, or 1013 and the second electrode 18, holes and electrons are moved into the organic light emitting layer 19 or 20 and are combined with each other in the organic light emitting layer 19 or 20. The organic electroluminescent device may include first and second supporting layers 11 and 17 for improving efficiencies of movement and combination of the holes and electrons. The first supporting layer 11 may be between each of the first electrodes 1011, 1012, and 1013 and each of the organic light emitting layers 19 and 20. The second supporting layer 17 may be between each of the second electrodes 18 and each of the organic light emitting layers 19 and 20.

The first supporting layer 11 may include a hole injecting layer (HIL) and a hole transfer layer (HTL), which are sequentially stacked. The second supporting layer 17 may include an electron transfer layer (ETL) and an electron injecting layer (EIL).

In the red sub-pixel 101, the first assistant layer 12 may be provided on the first supporting layer 11 or on the second supporting layer 17. In the green sub-pixel 102, the second assistant layer 13 may be provided on the first supporting layer 11 or on the second supporting layer 17. The first assistant layer 12 and the second assistant layer 13 may have optimized (or suitable) thicknesses for controlling an optical microresonator distance, described later. The first and second assistant layers 12 and 13 may be formed of a similar material to or a different organic material from a material of the supporting layers 11 and 17.

A distance between the first electrode 1011 and the second electrode 18 of the red sub-pixel 101, a distance between the first electrode 1012 and the second electrode 18 of the green sub-pixel 102, and a distance between the first electrode 1013 and the second electrode 18 of the blue sub-pixel 103 are different from each other to control the optical microresonator distance, described later.

The distance between the first electrode 1011 and the second electrode 18 of the red sub-pixel 101 is a first optical microresonator distance 191. The distance between the first electrode 1012 and the second electrode 18 of the green sub-pixel 102 is a second optical microresonator distance 192. And, the distance between the first electrode 1013 and the second electrode 18 of the blue sub-pixel 103 is a third optical microresonator distance 193. As described earlier, the first optical microresonator distance 191, the second optical microresonator distance 192, and the third optical microresonator distance 193 are different each other.

When a voltage is applied between the first and second electrodes 1011 and 18 of the red sub-pixel 101, the organic light emitting layer 19 of the red sub-pixel 101 emits light. The emitted light resonates between the first and second electrodes 1011 and 18 within the first optical microresonator distance 191. Thus, constructive interference or destructive interference occurs in the light resonating in the red sub-pixel 101, so that light of a red wavelength is emitted from the red sub-pixel 101.

When a voltage is applied between the first and second electrodes 1012 and 18 of the green sub-pixel 102, the organic light emitting layer 20 of the green sub-pixel 102 emits light. The light emitted from the organic light emitting layer 20 of the green sub-pixel 102 resonates between the first and second electrodes 1012 and 18 within the second optical microresonator distance 192. Thus, constructive interference or destructive interference occurs in the light resonating in the green sub-pixel 102, so that light of a green wavelength is emitted from the green sub-pixel 102.

When a voltage is applied between the first and second electrodes 1013 and 18 of the blue sub-pixel 103, the organic light emitting layer 20 of the blue sub-pixel 103 emits light. The light emitted from the organic light emitting layer 20 of the blue sub-pixel 103 resonates between the first and second electrodes 1013 and 18 within the third optical microresonator distance 193. Thus, constructive interference or destructive interference occurs in the light resonating in the blue sub-pixel 103, so that light of a blue wavelength is emitted from the blue sub-pixel 103.

If the organic electroluminescent device emits light in the back side direction, light in the back side direction of the light emitted from the organic light emitting layer 19 of the red sub-pixel 101 is partially transmitted through and is partially reflected by the first electrode 1011. The light reflected by the first electrode 1011 is totally reflected by the second electrode 18 of the red sub-pixel 101, and then travels in the back side direction. Thus, the constructive interference or destructive interference of the light occurs in the red sub-pixel 101.

If the organic electroluminescent device emits light in the back side direction, light in the back side direction of the light emitted from the organic light emitting layer 20 of the green sub-pixel 102 is partially transmitted through and is partially reflected by the first electrode 1012. The light reflected by the first electrode 1012 is totally reflected by the second electrode 18 of the green sub-pixel 102, and then travels in the back side direction. Thus, the constructive interference or destructive interference of the light occurs in the green sub-pixel 102.

If the organic electroluminescent device emits light in the back side direction, light in the back side direction of the light emitted from the organic light emitting layer 20 of the blue sub-pixel 103 is partially transmitted through and is partially reflected by the first electrode 1013. The light reflected by the first electrode 1013 is totally reflected by the second electrode 18 of the blue sub-pixel 103, and then travels in the back side direction. Thus, the constructive interference or destructive interference of the light occurs in the blue sub-pixel 103.

The optical microresonator distance may be controlled (or set or predefined) for causing selective constructive interference and selective destructive interference of light. The constructive interference occurs in a specific light by the optical microresonator distance. The optical microresonator distance and a peak wavelength of the specific light of the constructive interference are expressed by the following equation 1.

$$L = \frac{\lambda}{2}(2M) \quad \text{[Equation 1]}$$

In the equation 1, "L" denotes the optical microresonator distance, "λ" denotes the peak wavelength of the specific light, and "M" denotes an integer equal to or greater than 1. The optical microresonator distance L should satisfy the equation 1 for the constructive interference of the specific light. The first, second, and third optical microresonator distance 191, 192, and 193 may be controlled to cause the constructive interference and/or the destructive interference of the lights emitted from the organic light emitting layers 19 and 20 of the red, green, and blue sub-pixels 101, 102, and 103.

According to one embodiment of the present invention, the structures of the red, green, and blue sub-pixels 101, 102, and 103 are different from each other, so that the first, second, and third optical microresonator distances 191, 192, and 193 are different from each other.

For example, the red sub-pixel 101 may include the first assistant layer 12, the red light emitting layer 14, the blue light emitting layer 15, and the green light emitting layer 16, so that it has the first optical microresonator distance 191. Thicknesses of the layers 12, 14, 15, and 16 may be controlled (or set or predefined) to control the first optical microresonator distance 191. Due to the controlled first optical microresonator distance 191, the constructive interference occurs for only the red light emitted from the red light emitting layer 14 of the red sub-pixel 101, and the destructive interference occurs for the blue light and the green light respectively emitted from the blue light emitting layer 15 and the green light emitting layer 16 of the red sub-pixel 101 when the voltage is applied between the first and second electrodes 1011 and 18. According to one embodiment, the first optical microresonator distance 191 satisfies the following equations 2, 3, and 4.

$$D1 = \frac{\lambda_1}{2}(2m) \quad \text{[Equation 2]}$$

$$D1 = \frac{\lambda_2}{2}(2n+1) \quad \text{[Equation 3]}$$

$$D1 = \frac{\lambda_3}{2}(2\ell+1) \quad \text{[Equation 4]}$$

In the equations 2, 3, and 4, "D1" denotes the first optical microresonator distance 191, "$\lambda_1$" denotes a wavelength of the red light, "$\lambda_2$" denotes a wavelength of the green light, "$\lambda_3$" denotes a wavelength of the blue light, and each of "m", "n", and "l" denotes an integer equal to or greater than 1. Because the first optical microresonator distance 191 satisfies all of the equations 2, 3, and 4, the red light may be emitted from the red sub-pixel 101.

The green sub-pixel 102 may include the second assistant layer 13, the blue light emitting layer 15, and the green light emitting layer 16, so that it has the second optical microresonator distance 192. Thickness of the layers 13, 15, and 16 may be controlled (or set or predefined) to control the second optical microresonator distance 192. Due to the controlled second optical microresonator distance 192, the constructive interference occurs for only the green light emitted from the green light emitting layer 16 of the green sub-pixel 102, and the destructive interference occurs for the blue light emitted from the blue light emitting layer 15 of the green sub-pixel 102 when the voltage is applied between the first and second electrodes 1012 and 18. According to one embodiment, the second optical microresonator distance 192 satisfies the following equations 5 and 6.

$$D2 = \frac{\lambda_2}{2}(2n) \quad \text{[Equation 5]}$$

$$D2 = \frac{\lambda_3}{2}(2\ell+1) \quad \text{[Equation 6]}$$

In the equations 5 and 6, "D2" denotes the second optical microresonator distance 192, "$\lambda_2$" denotes a wavelength of the green light, "$\lambda_3$" denotes a wavelength of the blue light, and each of "n" and "l" denotes an integer equal to or greater than 1. Because the second optical microresonator distance 192 satisfies all of the equations 5 and 6, the green light may be emitted from the green sub-pixel 102.

The blue sub-pixel 103 may include the blue light emitting layer 15 and the green light emitting layer 16 so that it has the third optical microresonator distance 193. Thicknesses of each of the layers 15 and 16 may be controlled (or set or predefined) to control the third optical microresonator distance 193. Due to the controlled third optical microresonator distance 193, the constructive interference occurs for only the blue light emitted from the blue light emitting layer 15 of the blue sub-pixel 103, and the destructive interference occurs for the green light emitted from the green light emitting layer 16 of the blue sub-pixel 103 when the voltage is applied between the first and second electrodes 1013 and 18. According to one embodiment, the third optical microresonator distance 193 satisfies the following equations 7 and 8.

$$D3 = \frac{\lambda_3}{2}(2l) \qquad [\text{Equation 7}]$$

$$D3 = \frac{\lambda_2}{2}(2n+1) \qquad [\text{Equation 8}]$$

In the equations 7 and 8, "D3" denotes the third optical microresonator distance 193, "$\lambda_3$" denotes a wavelength of the blue light, "$\lambda_2$" denotes a wavelength of the green light, and each of "n" and "l" denotes an integer equal to or greater than 1. Because the third optical microresonator distance 193 satisfies all of the equations 7 and 8, the blue light may be emitted from the blue sub-pixel 103.

In a method of manufacturing the organic electroluminescent device, according to one embodiment of the present invention, described later, the blue light emitting layer 15 and the green light emitting layer 16 may be formed in the red, green, and blue sub-pixels 101, 102, and 103 at the same time. Thus, the thicknesses of the blue and green light emitting layers 15 and 16 in the red, green, and blue sub-pixels 101, 102, and 103 may be controlled concurrently (or simultaneously). As a result, when the optical microresonator distances 191, 192, and 193 are controlled, the thicknesses of the first and second assistant layers 12 and 13 may be controlled independently from each other and thicknesses of the blue and green light emitting layers 15 and 16 in the red, green, and blue sub-pixels 101, 102, and 103 may be controlled at the same time (e.g., concurrently or simultaneously).

When the blue light emitting layer 15 and the green light emitting layer 16 are provided for controlling the first, second, and third optical microresonator distances 191, 192, and 193, the blue light emitting layer 15 may be under the green light emitting layer 16, or the green light emitting layer 16 may be under the blue light emitting layer 15.

Figure 2:
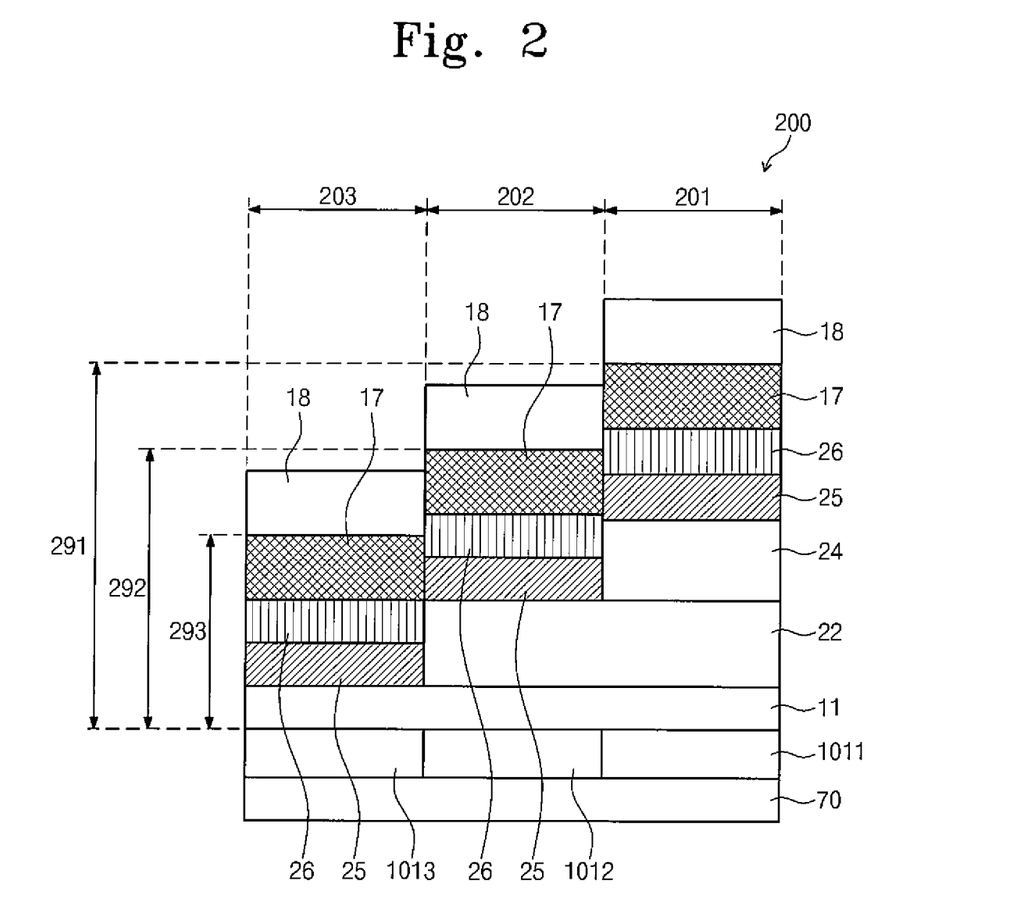
FIG. 2 is a cross-sectional view illustrating an organic electroluminescent device according to an embodiment of the present invention.

FIG. 2 is a cross-sectional view illustrating an organic electroluminescent device according to one embodiment of the present invention. In the present embodiment, the same elements as described in the aforementioned embodiment will be indicated by the same reference numerals, and the descriptions to the same elements as in the aforementioned embodiment may be given by way of reference thereto.

Referring to FIG. 2, an assistant layer 22 of one body may be in red and green sub-pixels 201 and 202. The assistant layer 22 in the red sub-pixel 201 may laterally contact the assistant layer 22 in the green sub-pixel 202 without an interface therebetween, so that, for example, the assistant layer 22 in the red and green sub-pixels 201 and 202 may constitute one body. A blue sub-pixel 203 may not include the assistant layer 22. Each of the red, green, and blue sub-pixels 201, 202, and 203 includes a blue light emitting layer 25 and a green light emitting layer 26. The red sub-pixel 201 further includes a red light emitting layer 24. Thus, a first optical microresonator distance 291 of the red sub-pixel 201 may be different from a second optical microresonator distance 292 of the green sub-pixel 202 by a thickness of the red light emitting layer 24. The second optical microresonator distance 292 of the green sub-pixel 202 may be different from a third optical microresonator distance 293 of the blue sub-pixel 203 by a thickness of the assistant layer 22 in the green sub-pixel 202. The first optical microresonator distance 291 may be different from the third optical microresonator distance 293 by the thicknesses of the assistant layer 22 and the red light emitting layer 24. The first, second, and third optical microresonator distances 291, 292, and 293 may be controlled so that the red, green, and blue sub-pixels 201, 202, and 203 emit the red light, the green light, and the blue light, respectively.

As a result, a display device including the organic electroluminescent device according to an embodiment of the present invention may provide a full-colored image to viewers through the plurality of main pixels 100, of which each includes the red sub-pixel 101, the green sub-pixel 102, and the blue sub-pixel 103.

A method of manufacturing an organic electroluminescent device according to embodiments of the present invention will be described hereinafter with reference to FIGS. 3 to 5E. In the method according to the present embodiment, the same elements as described in the aforementioned embodiments will be indicated by the same reference numerals, and the descriptions to the same elements as in the aforementioned embodiments may be given by way of reference thereto.

Figure 3:
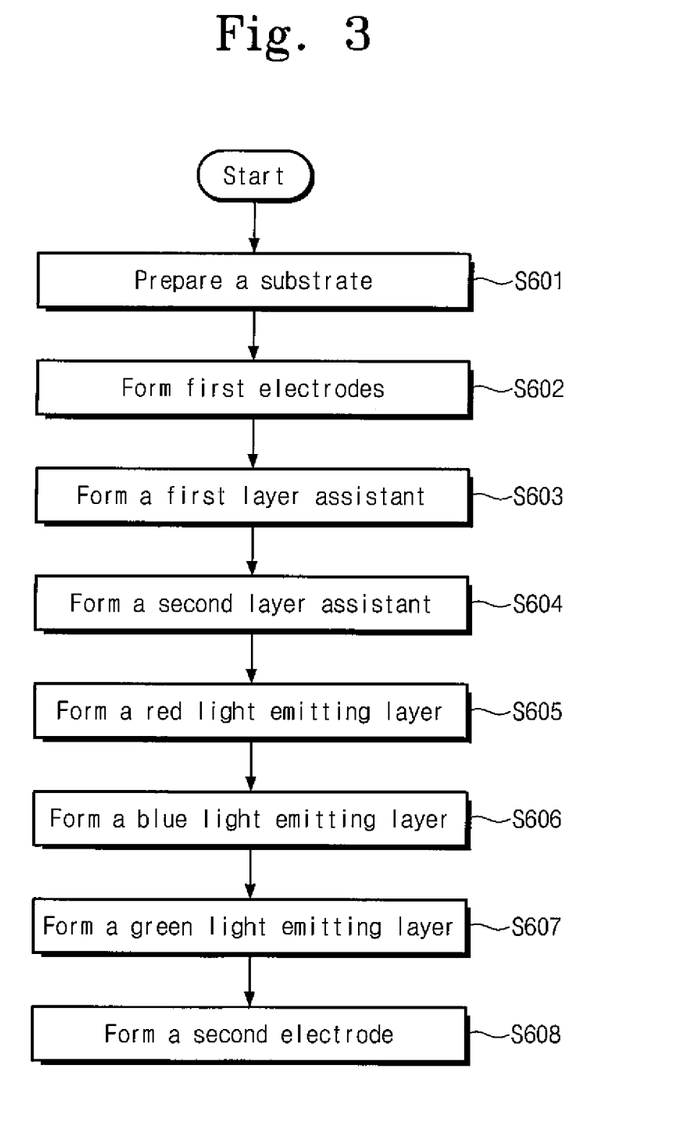
FIG. 3 is a flowchart illustrating a method of manufacturing an organic electroluminescent device according to an embodiment of the present invention.

FIG. 3 is a flowchart illustrating a method of manufacturing an organic electroluminescent device according to embodiments of the present invention, FIG. 4 is a plan view illustrating a substrate; and FIGS. 5A to 5E are cross-sectional views relating to portions of a method of manufacturing an organic electroluminescent device according to embodiments of the present invention.

Referring to FIG. 3, the method of manufacturing an organic electroluminescent device includes: preparing a substrate (S601), forming first electrodes (S602), forming a first assistant layer (S603), forming a second assistant layer (S604), forming a red light emitting layer (S605), forming a blue light emitting layer (S606), forming a green light emitting layer (S607), and forming a second electrode (S608).

Referring to FIG. 4, when preparing a substrate (S601), a substrate 70 including sub-pixel regions 71, 72, and 73 is prepared. The substrate 70 has a plurality of main pixel regions. Each of the main pixel regions includes a red pixel region 71, a green pixel region 72, and a blue pixel region 73. The red sub-pixel 101, the green sub-pixel 102, and the blue sub-pixel 103 may be formed on the red, green, and blue sub-pixel regions 71, 72, and 73 in one-to-one correspondence by a manufacturing method described later.

The substrate 70 may be formed of, for example, a thin metal, a semiconductor, a thin metal layer, an insulating material, glass, quartz, or plastic. The substrate 70 may be flexible. A plurality of transistors (not shown) may be provided on the substrate 70. The transistors may be electrically connected to the first electrodes 1011, 1012, and 1013 of the red, green, and blue sub-pixels 101, 102, and 103, respectively. Thus, the transistors may switch driving signals provided to the first electrodes 1011, 1012, and 1013 of the red, green, and blue sub-pixels 101, 102, and 103.

Each of the transistors may include a gate electrode, a source electrode, an active pattern, and a drain electrode. A gate insulating layer may be provided to insulate the gate electrode from another conductive pattern adjacent to the gate electrode, and an interlayer insulating layer may be provided to insulate the source and drain electrodes from other conductive patterns.

Figure 5A:
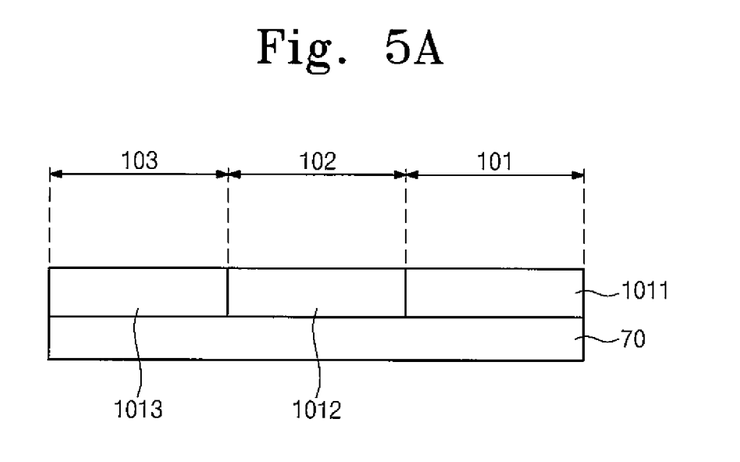
FIGS. 5A to 5E are cross-sectional views showing a method of manufacturing an organic electroluminescent device according to an embodiment of the present invention.

Referring to FIG. 5A, when forming the first electrodes (S602), the first electrodes 1011, 1012, and 1013 are formed on the red, green, and blue sub-pixel regions, respectively Because the first electrodes 1011, 1012, and 1013 of the red, green, and blue sub-pixels 101, 102, and 103 may receive the driving signals from the transistors independently from each other, they may be electrically insulated from each other.

Either the first electrodes 1011, 1012, or 1013 or the second electrode 18 may be an anode, and the other may be cathode. For improving injection efficiencies of holes and electrons, the anode may be formed of a metal having a high work function and the cathode may be formed of a metal having a low work function. The anode may include a transparent conductive metal oxide. For example, the transparent conductive metal oxide of the anode may include at least one of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO). Thicknesses of the metals of the anode and the cathode may be determined depending on an emitting direction (e.g., the front side direction or the back side direction) of the organic electroluminescent device and functions (e.g., the anode, the cathode) of the first electrodes 1011, 1012, or 1013 and the second electrode 18.

If the first electrodes 1011, 1012, or 1013 are anodes, and the organic electroluminescent device emits light in the front side direction, the anodes may include a thin metal having a light reflection property and the transparent conductive metal oxide on the thin metal. As described above, the transparent conductive metal oxide may include at least one of ITO, IZO, AZO, GZO, ZTO, GTO, and FTO. In this case, the second electrode 18 corresponds to the cathode, and the cathode may be formed of, for example, a thin metal having a semitransparent property. The metal of the cathode may include at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and any alloy thereof. The cathode may be realized as a thin metal layer. The thin metal layer may partially transmit and partially reflect light. However, the present invention is not limited thereto; for example, the second electrode 18 may be formed of at least one of other conductive materials capable of partially transmitting and partially reflecting light.

If the first electrodes 1011, 1012, or 1013 are the anodes and the organic electroluminescent device emits the light in the back side direction, the anodes may include a thin semi-transparent metal and the transparent conductive metal oxide on the thin semiconductor metal. As described above, the transparent conductive metal oxide may include at least one of ITO, IZO, AZO, GZO, ZTO, GTO, and FTO. In this case, the second electrode 18 corresponds to the cathode, and the cathode may be formed of a thick metal having a total reflection property. For example, the metal of the cathode may include at least one of chromium (Cr), silver (Ag), aluminum (Al), magnesium (Mg), molybdenum (Mo), titanium (Ti), copper (Cu), tantalum (Ta), platinum (Pt), tungsten (W), or any alloy thereof.

Figure 5B:
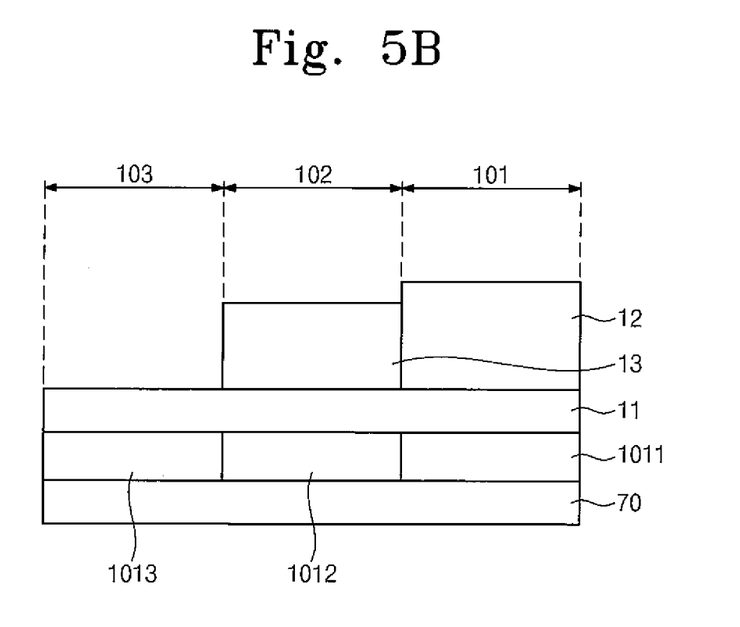

Referring to FIG. 5B, when forming the first assistant layer 12 (S603), the first assistant layer 12 is formed on the first electrode 1011 in the red sub-pixel region 71.

When forming the second assistant layer 13 (S604), the second assistant layer 13 is formed on the first electrode 1012 in the green sub-pixel region 72.

The first assistant layer 12 and the second assistant layer 13 may be formed by evaporation deposition processes using a first mask and a second mask, respectively. Thicknesses of the first and second assistant layers 12 and 13 may be different from each other. The first mask and second mask may be fine metal masks (FMMs). The first and second masks may be finely patterned for depositing the first and second assistant layers 12 and 13 in the red and green sub-pixels regions 71 and 72, respectively.

Processes of forming the first and second assistant layers 12 and 13 will be described in more detail hereinafter. The first mask may be located on the first electrodes 1011, 1012, and 1013 in a vacuum chamber. For example, the first mask may be located for depositing the first assistant layer 12 in the red sub-pixel region 71 of the sub-pixels regions 71, 72, and 73. The first assistant layer 12 may be deposited on the first electrode 1011 of the red sub-pixel region 71, and then, the first mask is removed to expose the first assistant layer 12. The second mask may be located on the first electrodes 1011, 1012, and 1013 for depositing the second assistant layer 13 in the green sub-pixel region 72 of the sub-pixels regions 71, 72, and 73, and then the second assistant layer 13 may be deposited. The second mask is removed to expose the second assistant layer 13.

Figure 5C:
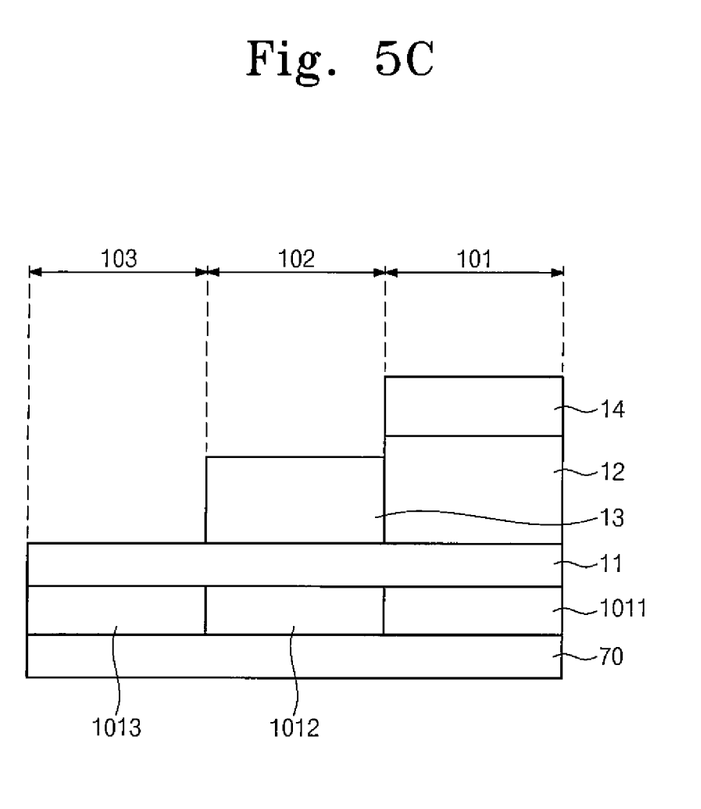

Referring to FIG. 5C, when forming the red light emitting layer 14 (S605), the red light emitting layer 14 is formed on the first assistant layer 12 in the red sub-pixel region 71.

At this time, the red light emitting layer 14 may be formed using a third mask. The third mask may be finely patterned for forming the red light emitting layer 14. The third mask may be a fine metal mask (FMM). The third mask may be located on the first electrodes 1011, 1012, and 1013, and then, the red light emitting layer 14 may be deposited in the red sub-pixel region 71. The third mask is removed to expose the red light emitting layer 14.

Figure 5D:
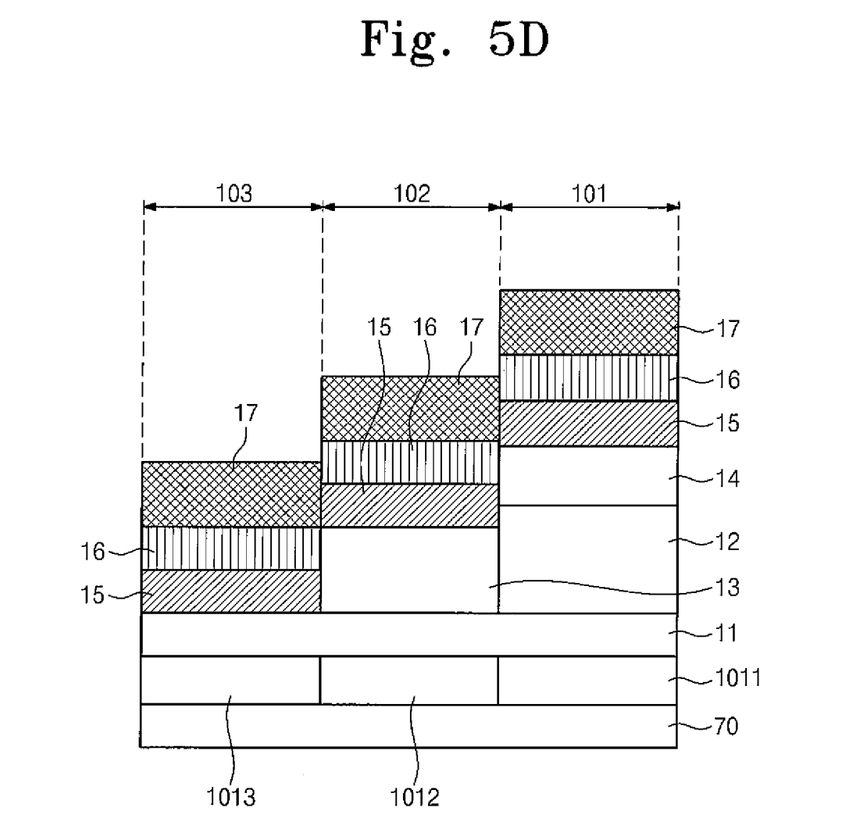

Referring to FIG. 5D, when forming the blue light emitting layer 15 (S606), the blue light emitting layer 15 is formed on the red light emitting layer 14 in the red sub-pixel region 71, on the second assistant layer 13 in the green sub-pixel region 72, and on the first electrode 1013 in the blue sub-pixel region 73.

The blue light emitting layer 15 may be deposited on the red, green, and blue sub-pixels regions 71, 72, 73 using an open mask.

When forming the green light emitting layer 16 (S607), the green light emitting layer 16 is formed on the blue light emitting layer 15 in the red, green, and blue sub-pixel regions 71, 72, 73.

The green light emitting layer 16 may be deposited on the red, green, and blue sub-pixels regions 71, 72, 73 using the open mask.

In one embodiment, the blue light emitting layer 15 is formed, and then the green light emitting layer 16 is formed. However, the green light emitting layer 16 may be formed first, and then the blue light emitting layer 16 may be formed after the green light emitting layer 16.

An organic light emitting material used in the light emitting layers 14, 15, and 16 may include at least one of polyfluorene derivatives, (poly)paraphenylenevinylene derivatives, polyphenylene derivatives, polyvinylcarbazole derivatives, polythiophene derivatives, anthracene derivatives, butadiene derivatives, tetracene derivatives, distyrylarylene derivatives, benzazole derivatives, or carbazole derivatives.

Figure 5E:
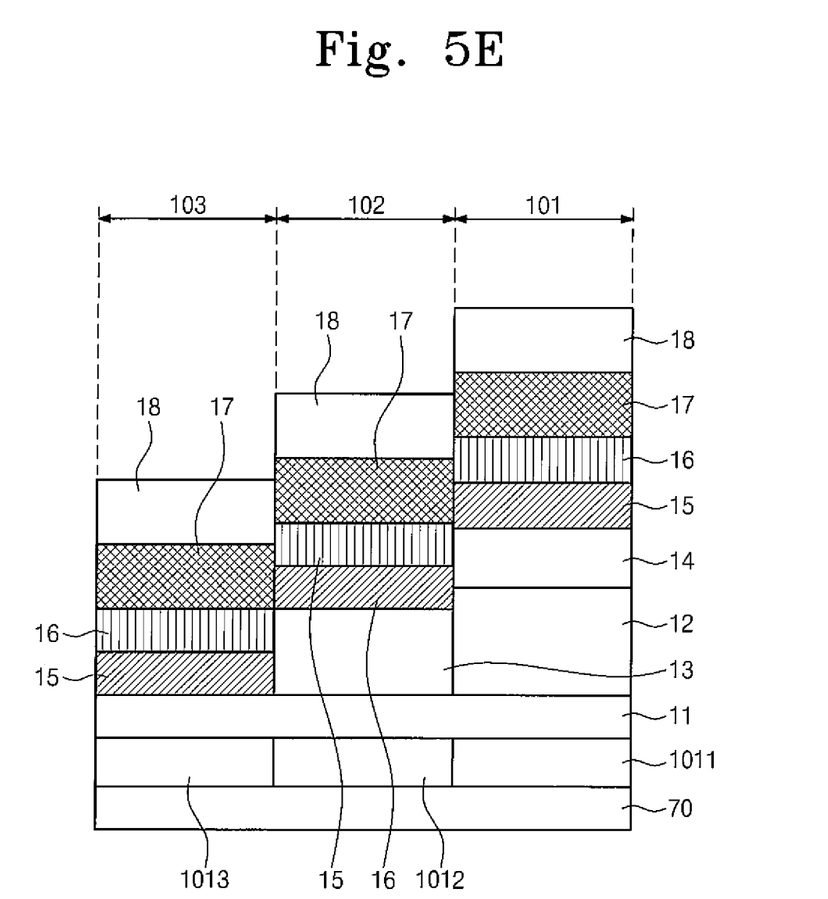

Referring to FIG. 5E, the second electrode 18 is formed on the green light emitting layer 16 in the red, green, and blue sub-pixels regions 71, 72, 73 as a common layer.

The organic electroluminescent device may further include the first and second supporting layers 11 and 17 between each of the first electrodes 1011, 1012, and 1013 and each of the organic light emitting layers 19 and 20 and between each of the second electrodes 18 and each of the organic light emitting layers 19 and 20 for improving efficiencies of the organic light emitting layers 19 and 20. The first supporting layer 11 may include the hole injecting layer (HIL) and the hole transfer layer (HTL), which may be sequentially stacked, and the second supporting layer 17 may include the electron transfer layer (ETL) and the electron injecting layer (EIL), which may be sequentially stacked.

If the first electrodes 1011, 1012, and 1013 correspond to the anodes and the second electrodes 18 correspond to the cathodes, the first supporting layer 11 adjacent to the first electrodes 1011, 1012, and 1013 may be formed of a material having a highest occupied molecular orbital (HOMO) level between a work function of the first electrodes 1011, 1012, and 1013 and a HOMO level of the organic light emitting material. The second supporting layer 17 adjacent to the second electrodes 18 may be formed of a material having a lowest unoccupied molecular orbital (LUMO) level between a work function of the second electrodes 18 and a LUMO level of the organic light emitting material.

A material used as the first supporting layer 11 may include at least one of diamines, MTDATA([4,4',4"-tris(3-methylphenyl)phenylamino]triphenylamine), TPD(N,N'-diphenyl-N,N'-di(3-methylphenyl)-1,1'-biphenyl-4,4'-diamine), 1,1-bis(4-di-p-tolylaminophenyl)cyclohexane), N,N,N',N'-tetra(2-naphthyl)-4,4-diamino-p-terphenyl, 4,4',4-tris[(3-methylphenyl)phenylamino]triphenylamine, polypyrrole, polyaniline, or poly-(3,4-ethylenedioxythiophene:polystyrenesulfonate (PEDOT:PSS). A material used as the second supporting layer 17 may include at least one of tris(8-quinolate)aluminum derivatives, o-, m- or p-phenanthroline derivatives, oxadiazole derivatives, or triazole derivatives.

Each of the first and second supporting layers 11 and 17 may be disposed in common in the red, green, and blue sub-pixels 101, 102, 103 using an open mask.

According to the method of manufacturing the organic electroluminescent device described above, the organic electroluminescent device may be manufactured using three fine metal masks (i.e., the first, second, and third mask). In a comparison example, a first assistant layer, a second assistant layer, a red light emitting layer, a green light emitting layer, and a blue light emitting layer are deposited using fine metal masks different from each other, respectively. Thus, for example, five fine metal masks may be needed for the comparison example. As the number of fine metal masks increases, depositing yields may be reduced and manufacture costs of an organic electroluminescent device may increase. Additionally, a cleaning time period of fine metal masks may be increased. However, the aforementioned embodiments of the present invention may reduce the number of the fine metal masks. Thus, a yield of mass production of organic electroluminescent devices may increase and the manufacture costs may be reduced. Additionally, a manufacture time of the organic luminescent device may also be reduced.

If the organic luminescent device is manufactured using the assistant layer 22 of the one body in FIG. 2, it may be manufactured using two fine metal masks.

According to embodiments of the present invention, the number of deposition processes using the fine metal masks may be reduced to improve a deposition yield and to reduce manufacture costs of the organic electroluminescent device. Additionally, cleaning processes of the fine metal masks may be reduced.

While the present invention has been described with reference to example embodiments, it will be apparent to those skilled in the art that various changes and modifications may be made without departing from the spirit and scope of the present invention. Therefore, it should be understood that the above embodiments are not limiting, but illustrative. Thus, the scope of the present invention is to be determined by the following claims and their equivalents.

What is claimed is:

1. An organic electroluminescent device comprising:
a plurality of main pixels, each of the main pixels comprising a red sub-pixel, a green sub-pixel, and a blue sub-pixel,
wherein each of the red sub-pixel, the green sub-pixel, and the blue sub-pixel comprises:
a first electrode;
a second electrode opposite to the first electrode; and
an organic light emitting layer between the first electrode and the second electrode, the organic light emitting layer comprising a blue light emitting layer and a green light emitting layer,
wherein one of the first electrode or the second electrode comprises a semitransparent material and an other one of the first electrode or the second electrode comprises a light reflection material, and
wherein an optical microresonator distance is defined between the first electrode and the second electrode, the optical microresonator distance of one of the red sub-pixel, the green sub-pixel, or the blue sub-pixel is different from the optical microresonator distance of other ones of the red sub-pixel, the green sub-pixel, or the blue sub-pixel.

2. The organic electroluminescent device of claim 1, wherein the organic light emitting layer of the red sub-pixel further comprises a red light emitting layer.

3. The organic electroluminescent device of claim 2, wherein the optical microresonator distance between the first electrode and the second electrode of the red sub-pixel satisfies equations 1, 2, and 3:

$$D1 = \frac{\lambda_1}{2}(2m) \quad \text{[Equation 1]}$$

$$D1 = \frac{\lambda_2}{2}(2n+1) \quad \text{[Equation 2]}$$

$$D1 = \frac{\lambda_3}{2}(2\ell+1) \quad \text{[Equation 3]}$$

wherein "D1" denotes the optical microresonator distance between the first electrode and the second electrode of the red sub-pixel, "λ1" denotes a wavelength of a red light, "λ2" denotes a wavelength of a green light, "λ3" denotes a wavelength of a blue light, and each of "m", "n", and "l" denotes an integer equal to or greater than 1.

4. The organic electroluminescent device of claim 2, wherein the optical microresonator distance between the first electrode and the second electrode of the green sub-pixel satisfies equations 1 and 2:

$$D2 = \frac{\lambda_2}{2}(2n) \quad \text{[Equation 1]}$$

$$D2 = \frac{\lambda_3}{2}(2\ell+1) \quad \text{[Equation 2]}$$

wherein "D2" denotes the optical microresonator distance between the first electrode and the second electrode of the green sub-pixel, "λ2" denotes a wavelength of a green light, "λ3" denotes a wavelength of a blue light, and each of "n" and "l" denotes an integer equal to or greater than 1.

5. The organic electroluminescent device of claim 2, wherein the optical microresonator distance between the first electrode and the second electrode of the blue sub-pixel satisfies equations 1 and 2:

$$D3 = \frac{\lambda_3}{2}(2\ell) \quad \text{[Equation 1]}$$

$$D3 = \frac{\lambda_2}{2}(2n+1) \quad \text{[Equation 2]}$$

wherein "D3" denotes the optical microresonator distance between the first electrode and the second electrode of the blue sub-pixel, "λ3" denotes a wavelength of a blue light, "λ2" denotes a wavelength of a green light, and each of "l" and "n" denotes an integer equal to or greater than 1.

6. The organic electroluminescent device of claim 2, wherein the optical microresonator distance of the green sub-pixel is greater than the optical microresonator distance of the blue sub-pixel and is smaller than the optical microresonator distance of the red sub-pixel.

7. The organic electroluminescent device of claim 1, wherein the red sub-pixel further comprises: a first assistant layer between the organic light emitting layer and the first electrode of the red sub-pixel or between the organic light emitting layer and the second electrode of the red sub-pixel; and wherein the green sub-pixel further comprises: a second assistant layer between the organic light emitting layer and the first electrode of the green sub-pixel or between the organic light emitting layer and the second electrode of the green sub-pixel.

8. The organic electroluminescent device of claim 7, wherein the first assistant layer directly contacts the second assistant layer so that the first assistant layer and the second assistant layer comprises one body.

9. The organic electroluminescent device of claim 7, wherein a thickness of the first assistant layer is different from a thickness of the second assistant layer.

10. The organic electroluminescent device of claim 1, wherein each of the red sub-pixel, the green sub-pixel, and the blue sub-pixel further comprises:

a hole injecting layer and a hole transfer layer between the organic light emitting layer and the first electrode; and an electron injecting layer and an electron transfer layer between the organic light emitting layer and the second electrode.

\* \* \* \* \*